(12) United States Patent
Balish et al.

(10) Patent No.: US 6,329,297 B1
(45) Date of Patent: Dec. 11, 2001

(54) DILUTE REMOTE PLASMA CLEAN

(75) Inventors: Kenneth E. Balish, Fremont; Thomas Nowak, Sunnyvale; Tsutomu Tanaka, Santa Clara; Mark Beals, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/553,694

(22) Filed: Apr. 21, 2000

(51) Int. Cl.$^7$ ................................................ H01L 21/00
(52) U.S. Cl. .................... 438/714; 134/1.1; 156/345; 216/69; 216/67; 438/727; 438/730
(58) Field of Search ................................ 438/712, 714, 438/723, 726, 727, 729, 730, 743; 134/1.1, 31; 156/345 P, 345 MW; 216/67, 69, 79

(56) References Cited

U.S. PATENT DOCUMENTS

| | | | |
|---|---|---|---|
| 4,874,723 | 10/1989 | Jucha et al. | 437/245 |
| 5,087,434 | 2/1992 | Frenklach et al. | 423/446 |
| 5,089,441 | 2/1992 | Moslehi | 437/225 |
| 5,302,803 | 4/1994 | Stevens et al. | 219/121.43 |
| 5,328,558 | 7/1994 | Kawamura | 156/643 |
| 5,403,434 | 4/1995 | Moslehi | 156/643 |
| 6,067,999 | 5/2000 | Hines et al. | 134/1.1 |
| 6,245,192 | * 6/2001 | Dhindsa et al. | 438/729 X |
| 6,255,222 | * 7/2001 | Xia et al. | 438/726 X |

FOREIGN PATENT DOCUMENTS

| | | |
|---|---|---|
| 697 467 A1 | 2/1996 | (EP) . |
| 843 347 A2 | 5/1998 | (EP) . |

* cited by examiner

*Primary Examiner*—William A. Powell
(74) *Attorney, Agent, or Firm*—Townsend & Townsend & Crew

(57) ABSTRACT

A method and apparatus for enhancing the etch characteristics of a plasma formed in a remote plasma generator. A plasma formed in a remote plasma generator (27) is flown through a tube (62) to a plenum (60) where it is diluted to form a plasma mixture before flowing the plasma mixture into a processing chamber (15). The plasma mixture is used to clean deposits from the interior surfaces of the processing chamber, or can be used to perform an etch step on a process wafer within the processing chamber. In one embodiment, a plasma formed from $NF_3$ is diluted with $N_2$ to etch residue from the surfaces of a processing chamber used to deposit silicon oxide glass. Diluting the plasma increased the etching rate and made the etching rate more uniform across the diameter of the processing chamber.

19 Claims, 13 Drawing Sheets

DILUTE REMOTE PLASMA CLEAN

BACKGROUND OF THE INVENTION

The invention relates generally to deposition equipment, such as chemical vapor deposition (CVD) equipment used in the manufacture of semiconductor products, and more particularly to an apparatus and method for cleaning parts of a deposition system or etching process wafers using a remote plasma generator.

The fabrication of semiconductor products, such as integrated circuits, often involves the formation of layers on a substrate, such as a silicon wafer. Various techniques have been developed for the deposition processes, as the layers often involve different materials. For example, a metal layer might be deposited and patterned to form conductive interconnects, or a dielectric layer might be formed to electrically insulate one conductive layer from another. Some types of layer formation processes that have been used to form layers of dielectric materials and other materials are CVD processes.

Chemical vapor deposition processes include thermal deposition processes, in which precursor gases or vapors react in response to the heated surface of the substrate, as well as plasma-enhanced CVD ("PECVD") processes, in which electro-magnetic energy is applied to at least one precursor gas or vapor to transform the precursor into a more reactive plasma. Forming a plasma can lower the temperature required to form a film, increase the rate of formation, or both. Therefore, plasma-enhanced process are desirable in many applications.

When a layer is formed on a substrate some material is usually also deposited on the walls of the deposition chamber and other components of the deposition system as residue. The material on the walls of the chamber is generally undesirable because the residue can build up and become a source of particulate contamination, causing wafers to be rejected. Several cleaning procedures have been developed to remove residue from inside the chamber. One type of procedure, known as a "wet-clean" is performed by partially disassembling the deposition chamber and wiping the surfaces down with appropriate cleaning fluids. Other types of cleaning processes utilize a plasma to remove the residue by converting it to a volatile product that can be removed by the chamber exhaust system. These processes are known as "dry" cleans.

There are two general types of plasma dry cleaning processes. One type forms a plasma inside the processing chamber, or "in situ". The other type forms a plasma in a remote plasma generator and then flows the plasma into the processing chamber. Such a remote plasma cleaning process offers several advantages, such as providing a dry clean capability to a deposition system that does not have an in situ plasma system. Furthermore, a remote plasma system might be more efficient at converting cleaning plasma precursor gases or vapors into a plasma, and forming the plasma outside the chamber protects the interior of the chamber from potentially undesirable by-products of the plasma formation process, such as plasma heating and sputtering effects.

Some remote plasma systems use an inexpensive magnetron device, such as is used in consumer microwave ovens. Magnetrons are typically sold with a rated power output, and the remote plasma system is typically designed with the magnetron output power in mind. However, semiconductor substrates come in a variety of sizes. For example, many semiconductor fabrication facilities use 200 mm wafers, while other fabrication equipment is configured to process 300 mm wafers. It would be desirable to use a standard remote plasma system on a variety of processing equipment. Therefore, it is desirable to develop scaleable cleaning processes that can be adapted for various system configurations.

SUMMARY OF THE INVENTION

The present invention provides a method and apparatus for cleaning a deposition apparatus and for etching substrates in an efficient manner. In one embodiment, a microwave remote plasma generator generates plasma from a precursor gas. The plasma is diluted by mixing the plasma from the remote plasma generator with a diluent gas before flowing the mixture into the deposition chamber through a gas inlet, such as a gas distribution faceplate or similar structure. Diluting the plasma after formation of the plasma allows a greater total gas flow into the chamber through the faceplate without diluting the precursor gas in the plasma generator, thus maintaining the efficiency of the remote plasma generator for creating plasma. The greater flow also provides a higher velocity within the chamber, transporting plasma species, which decay over time, further in the same time period. This results in a higher concentration of plasma species further from the gas inlet, and improved cleaning or etching in the regions further from the gas inlet. Furthermore, by diluting the plasma, it is believed that the recombination of plasma species into less reactive or non-reactive species is inhibited. The result is a faster cleaning or etching process than is obtained using a non-diluted plasma for a given chamber.

In another embodiment, an etching plasma from a remote plasma generator is diluted to form an etching mixture. The etching mixture is used to etch a film on a process wafer in a processing chamber. Control of the etching rate and the etching profile across the diameter of the process wafer is achieved by selecting the amount of diluent in the etching mixture.

These and other embodiments of the present invention, as well as its advantages and features, are described in more detail in conjunction with the text below and attached figures.

DESCRIPTION OF THE SPECIFIC EMBODIMENTS

I. Introduction

The present invention cleans a deposition chamber more thoroughly, more uniformly, and faster by diluting a cleaning plasma formed in a remote plasma generator before flowing the mixture of cleaning plasma and diluent gas into the chamber. In a particular embodiment, a deposition system used to deposit silicon oxide films on substrates is cleaned using a mixture of a remotely-formed nitrogen trifluoride ($NF_3$) plasma that is subsequently diluted with diatomic nitrogen gas ($N_2$) before being introduced into the deposition chamber. The PECVD system uses tetraethylorthosilane ("TEOS") or silane as a deposition gas, for example. A remote microwave plasma generator efficiently converts undiluted $NF_3$ or other cleaning or etching precursor into a cleaning plasma that is diluted with $N_2$ or other generally non-reactive diluent gas before flowing the mixture into the deposition chamber through the gas inlet nozzle. The cleaning process may be used on deposition systems for use with 200 mm wafers, and scaled for use on 300 mm deposition systems. Varying the diluent flow allows varying the etch profile of the system, increases the etch rate, and reduces the time required to clean the chamber.

In another embodiment, a process wafer is etched using a etching plasma generated in a remote plasma generator and subsequently diluted with $N_2$ before being introduced into the chamber to etch the wafer. The etching plasma precursor flow is selected to optimize plasma conversion efficiency and/or conserve the precursor, while the diluent flow may be selected to control the etch profile across the wafer and/or the etch rate.

II. Exemplary Substrate Processing System

Figure 1A:
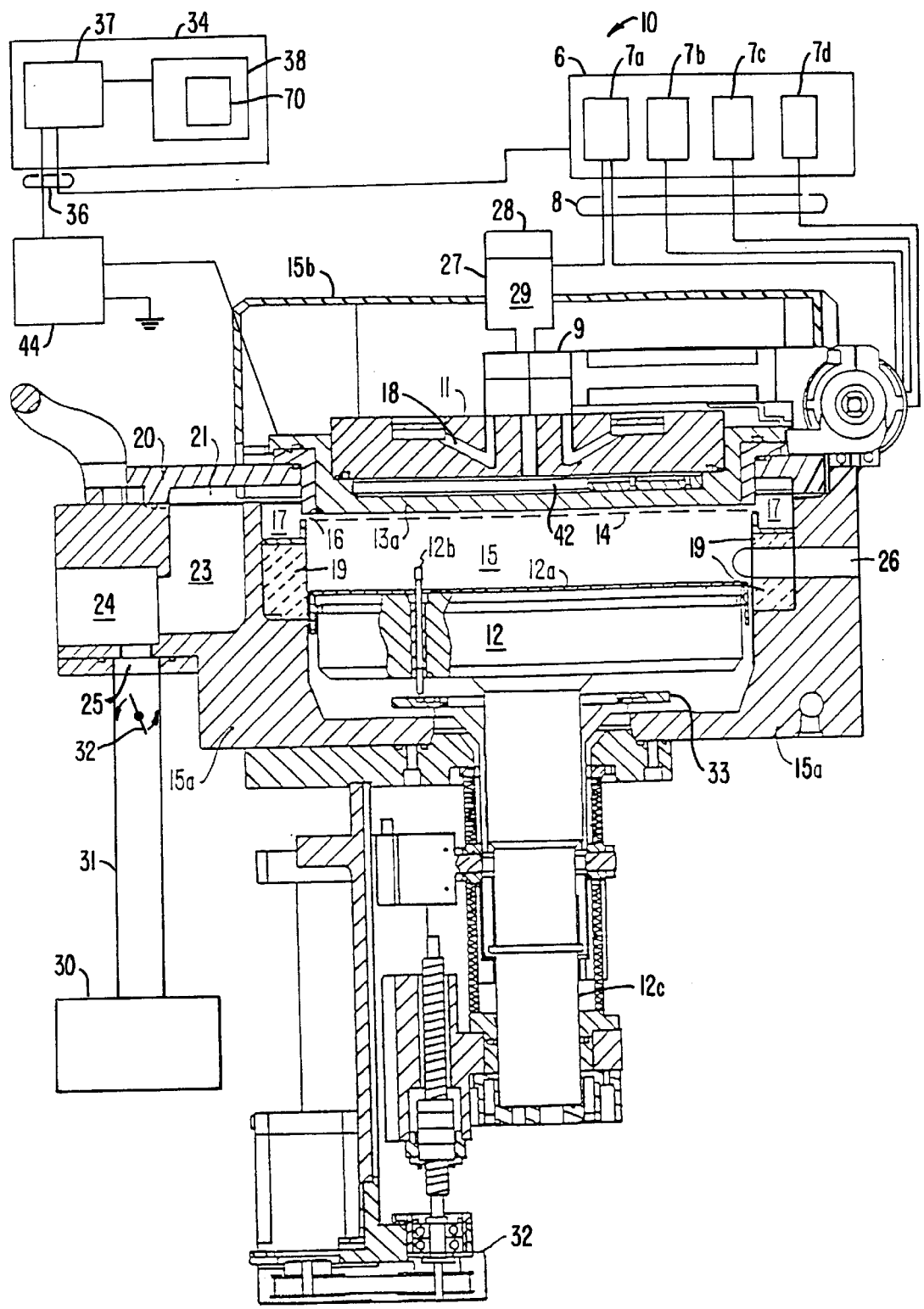
FIG. 1A is a simplified diagram of a chemical vapor deposition apparatus according to an embodiment of the present invention.
Figure 1B:
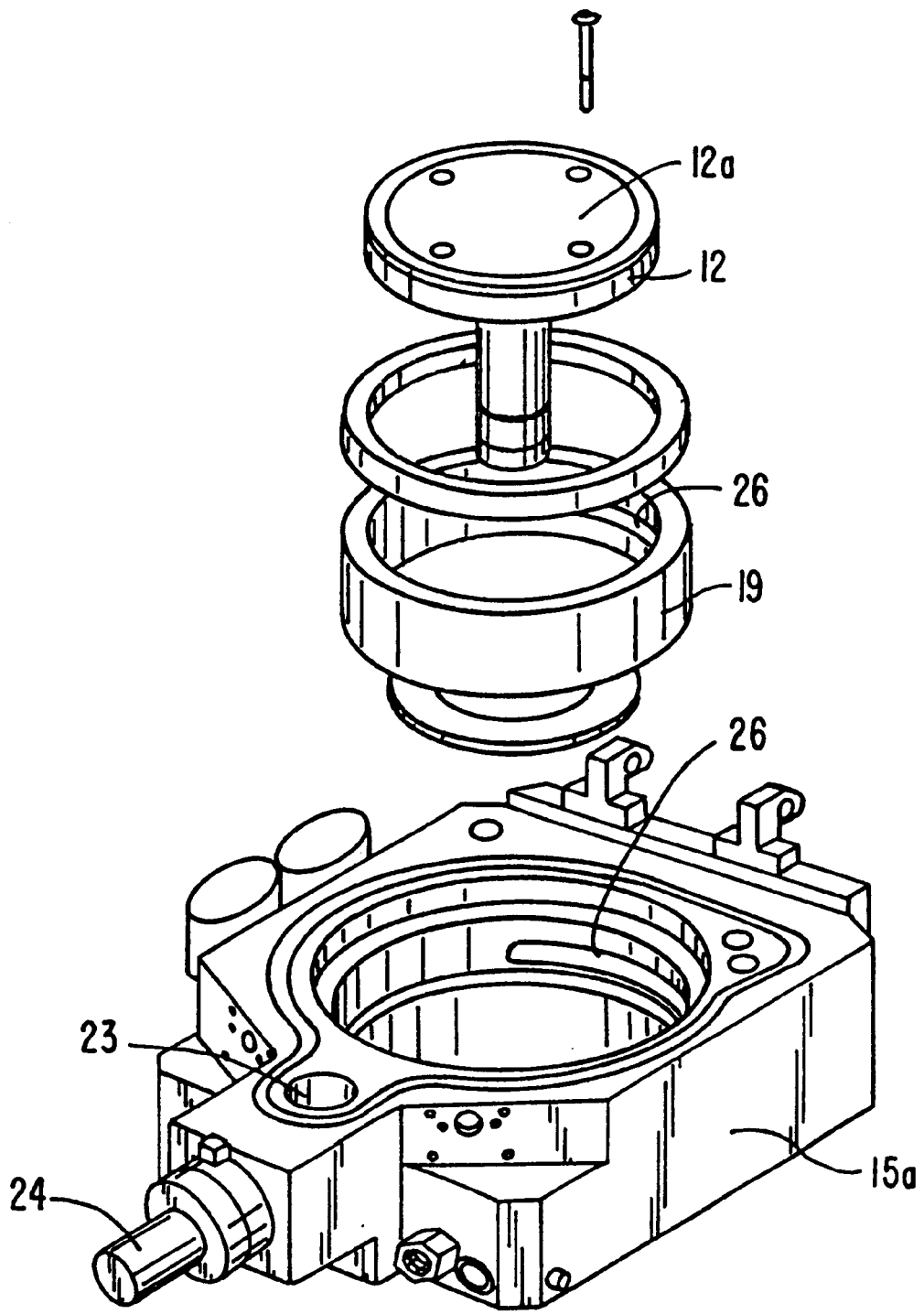
FIGS. 1B and 1C are exploded perspective views of parts of the CVD chamber depicted in FIG. 1A.
Figure 1C:
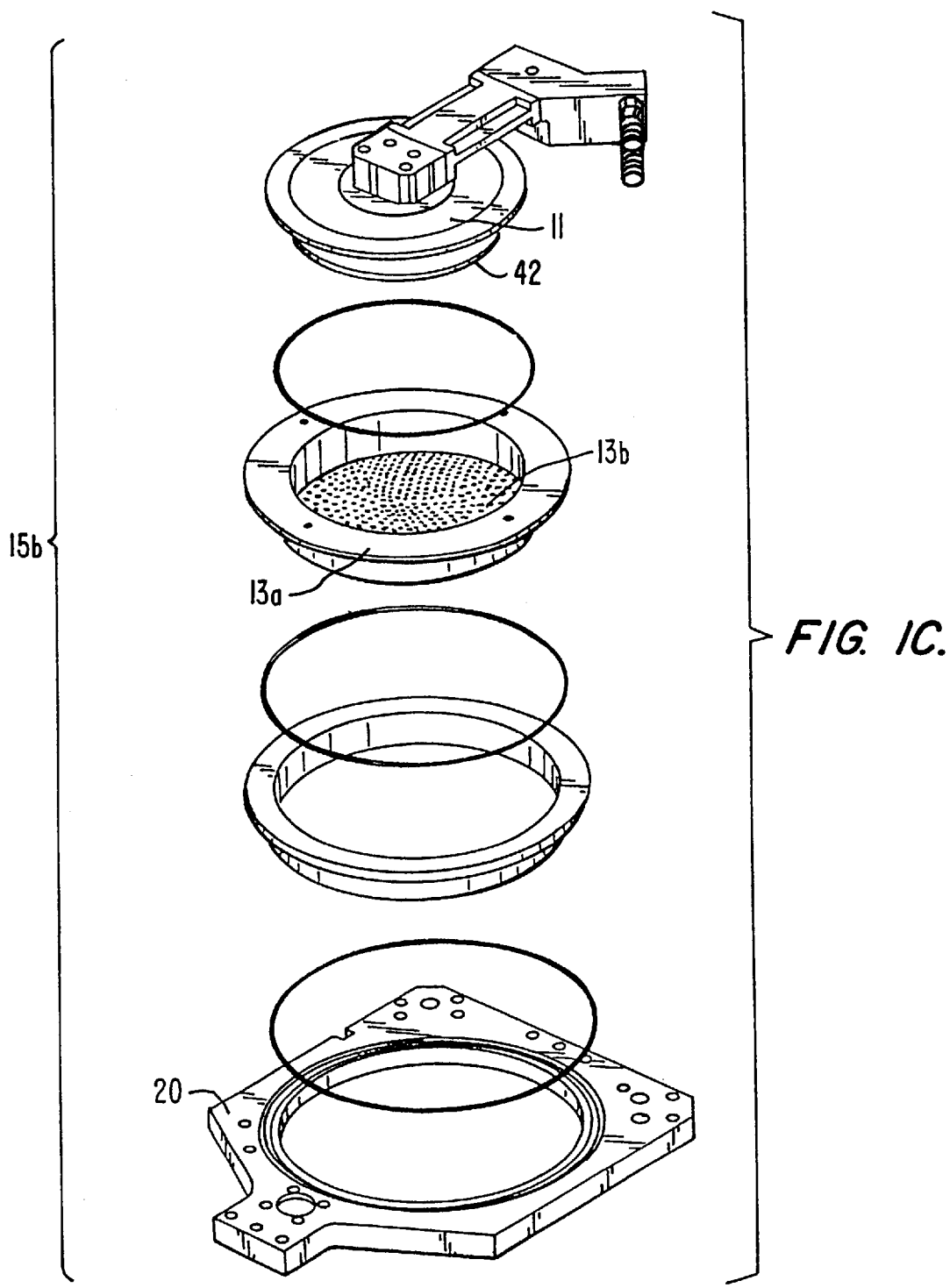
Figure 5A:
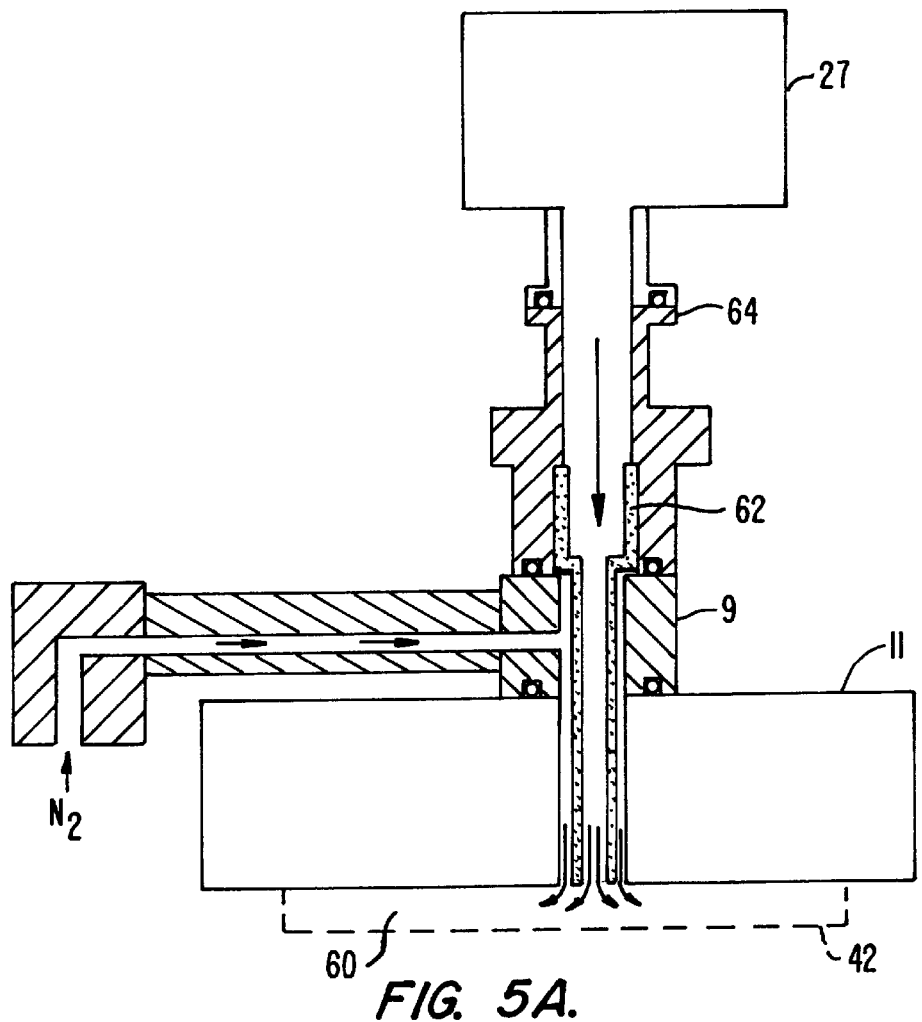
FIG. 5A is a simplified diagram of a portion of a plasma diluent configuration for use with a substrate processing system according to an embodiment of the present invention.

One suitable CVD apparatus in which the method of the present invention can be carried out is shown in FIG. 1A, which is a simplified diagram of a CVD system 10, having a vacuum or processing chamber 15 that includes a chamber wall 15a and a chamber lid assembly 15b. The chamber wall 15a and chamber lid assembly 15b are shown in greater detail in exploded, perspective views in FIGS. 1B and 1C. The chamber lid assembly shown in FIG. 1C is suitable for adaptation to an embodiment of the present invention, and is shown as an example. FIG. 5A shows additional details of a chamber lid according to the present invention.

The CVD system 10 contains a gas distribution manifold ("manifold") 11 for dispersing process gases to a substrate (not shown) that rests on a pedestal 12 within the process chamber. The pedestal may be may of metal, such as aluminum, ceramic, such as alumina or aluminum nitride, or other materials and combinations of materials. The pedestal may include an embedded resistance heater (not shown) to heat the substrate during processing, or other structures, such as a radio-frequency ("RF") electrode and/or susceptor. Various configurations can be used for an embedded resistance heater. In a preferred embodiment, a single element makes two full turns in the form of parallel concentric circles. Power is supplied to the heating element through wires in the stem 12c that pass through the bottom of the pedestal to an external power supply (not shown).

During processing, the substrate (e.g. a semiconductor wafer) is positioned on a flat (or slightly convex) surface 12a of pedestal 12. The pedestal can be moved controllably between a lower loading/off-loading position and an upper processing position (indicated by dashed line 14), which is closely adjacent to the manifold 11. A centerboard (not shown) has sensors for providing information on the position of the pedestal.

Gases are introduced into the chamber 15 through perforated holes, not shown in FIG. 1A for purposes of simplicity but that are shown in FIG. 1C, reference numeral 13b, of a flat, circular gas distribution faceplate ("faceplate") 13a. More specifically, deposition process gases flow into the chamber through the inlet manifold 11, through a perforated blocker plate 42 and then through the holes 13b in the gas distribution faceplate 13a.

A gas panel 6 includes gas sources 7a–d that supply gas to the manifold 11 through gas supply lines 8 into a mixing block 9, where the gases are mixed before flowing through the blocker plate 42 and the faceplate 13a into the chamber 15. The supply line for each process gas typically includes safety shut-off valves (not shown) at several points along the gas distribution path that can shut off the flow of gas automatically, either through local or remote control, or manually. The gas panel also includes mass flow controllers (also not shown) or other devices that control the flow of gas through the supply line and into the chamber. Those skilled in the art understand that the configuration shown in FIG. 1A is exemplary only, and that more or fewer gas sources can be used for a particular application, for example, or other modifications to the configuration may be appropriate.

The CVD system 10 can be configured to perform either thermal CVD processes or plasma-enhanced CVD ("PECVD") processes. PECVD processes may use a plasma formed in situ, or may use a plasma formed in a remote plasma generator 27. In an in situ PECVD process, an RF power supply 44 applies electrical power, such as RF power, between the gas distribution faceplate 13a and the pedestal 12 to form a plasma within the cylindrical region between the faceplate 13a and the surface 12a of the pedestal. (This region will be referred to herein as the "reaction region"). Constituents of the plasma react to form a desired film on the surface of the semiconductor wafer supported on pedestal.

The RF power supply 44 is a mixed frequency supply that can supply power at a high RF frequency (RF1) of 13.56 MHz and/or a low RF frequency (RF2) of 360 KHz. Using the mixed high and low frequencies to form the plasma enhances the decomposition of reactive species introduced into the vacuum chamber 15.

In a remote plasma process, a process gas from a gas source 7a is provided to the remote plasma generator 27. A microwave source 28 irradiates a plasma chamber 29 with microwave energy to form a plasma that flows through the gas distribution faceplate 13a into the chamber. When the plasma is formed in a remote plasma generator the typical byproducts of plasma formation, such as high-energy photons and heat, do not directly affect the process wafer or deposition chamber interior. Furthermore, some plasma precursors may be more efficiently dissociated in a remote microwave plasma generator than in a lower frequency in situ plasma system.

In a thermal process the process gas mixture reacts to deposit the desired films on the surface of the semiconductor wafer supported on pedestal 12, which is heated to provide thermal energy for the reaction. It is understood that plasma-enhanced CVD processes may heat the wafer, or the wafer may be heated to further promote or control the formation of a desired film on the wafer.

The temperature of the walls of the deposition chamber and surrounding structures, such as the exhaust passageway 23 and the shut-off valve 24, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in situ plasma process, or to limit formation of deposition products on the walls of the chamber. The gas distribution manifold 11 also has heat exchanging passages 18. Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber by a vacuum pump 30. Specifically, the gases are exhausted through an annular slot-shaped orifice 16 surrounding the reaction region into an annular exhaust plenum 17. The annular slot-shaped orifice 16 and the plenum 17 are defined by the gap between the top of the chamber's cylindrical side wall 15a (including the upper dielectric lining 19 on the wall) and the bottom of the circular chamber lid 20. The circular symmetry and uniformity of the slot orifice 16 and the plenum 17 create an essentially uniform flow of process gases over the wafer so as to deposit a uniform film on the wafer.

From the exhaust plenum 17, the gases flow underneath a lateral extension portion 21 of the exhaust plenum 17, past a viewing port (not shown), through the exhaust passageway 23, past the vacuum shut-off valve 24 (whose body is integrated with the lower chamber wall 15a), and into the exhaust outlet 25. A throttle valve 32 between the exhaust outlet 25 and the foreline 31 can be adjusted to maintain a selected pressure and/or gas flow in the chamber. In some processes or process steps, the position of the throttle valve is set according to a feedback signal from a pressure sensor (not shown) to the controller 34. In other processes or process steps, the feedback loop is disabled and the throttle valve is set to a fixed position. Opening the throttle valve all the way provides the maximum pumping rate. Thus, the exhaust draw on the chamber can be modulated with the throttle valve while the vacuum pump operates at a constant rate.

A lift mechanism operated by a motor 32 raises and lowers the heater pedestal assembly 12. When the pedestal is lowered wafer lift pins 12b contact the lift pin plate 33 and lift the wafer off the surface 12a of the pedestal. The wafer pins 12b are at the proper height to transfer wafers into and out of the through an insertion/removal opening 26 in the side of the chamber. A robot blade (not shown) can transfer wafers between chambers, or between a chamber and a wafer cassette. After loading a wafer, the motor lifts the wafer to a selected processing position.

A system controller 34 controls various subsystems and mechanisms of the deposition system 10. The wafer positioning system, gas delivery system, chamber pressure system, heating systems, and plasma systems are all controlled by the system controller 34 according to a program 70 stored in a computer-readable memory 38. Signals to and from the system controller are sent over control lines 36, only a few of which are shown for simplicity. The controller 34 relies on feedback signals from sensors, such as optical sensors, to determine the position of movable mechanical assemblies such as the throttle valve 32 and pedestal 12 which are moved by appropriate motors under the control of controller 34.

The memory 38 can include a hard drive, read-only memory, randomly addressable memory, a floppy disk drive or other suitable storage medium. A processor 37 contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

The system controller executes system control software, which is a computer program 70 stored in the computer-readable memory 38, to configure a general purpose deposition system into a particular deposition system. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, a floppy disk or other another appropriate drive, may also be used to operate controller 34.

Figure 1D:
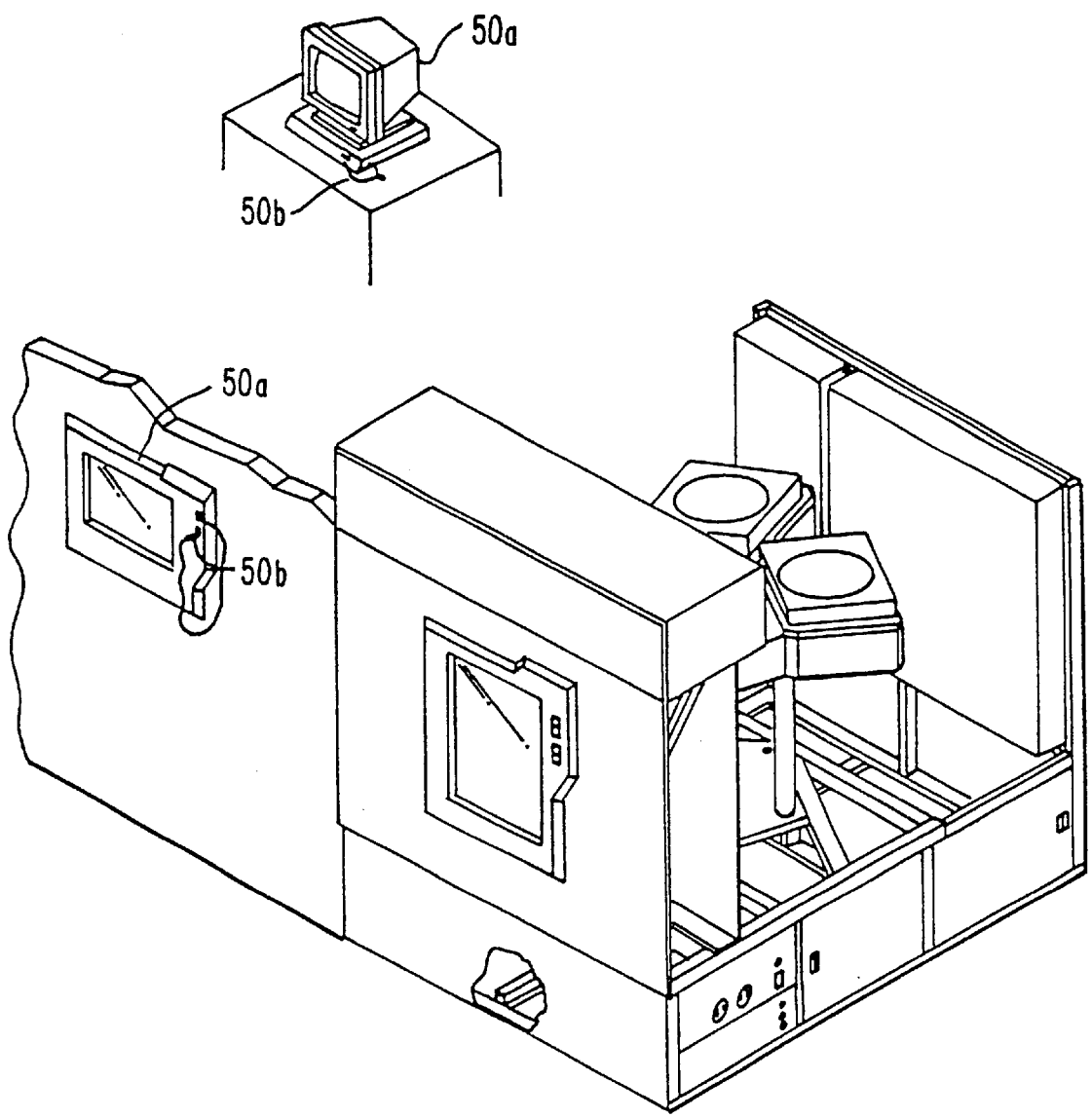
FIG. 1D is a simplified diagram of one embodiment of a system monitor that can be used to interface with the apparatus shown in FIG. 1A.

FIG. 1D shows a monitor 50a and light pen 50b that are coupled to the processor (not shown), as is known in the art. The monitor serves as the user interface between a user and the controller. The monitor is a cathode ray tube ("CRT"), and displays system status and other information, as well as receiving user input via the light pen. As shown in FIG. 1D, a substrate processing system may include more than one chamber, and a monitor may display information relating to each or any of the chambers in the system. In the preferred embodiment, two monitors 50a are used, one mounted in the clean room wall 52 for the operators and the other at a remote location, such as behind the clean room wall, for the service technicians or other purposes. The monitors 50a simultaneously display the same information, but only one light pen 50b is enabled. A light sensor in the tip of the light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to the light pen, to allow the user to communicate with controller.

The process for depositing the film can be implemented using a computer program product that is executed by the controller. The computer program code can be written in any conventional computer-readable programming language: for example, 68000 assembly language, C, C++, Pascal, FORTRAN or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled WINDOWS™ library routines. To execute the linked, compiled object code the system user invokes the object code, causing the computer system to load the code in memory. The CPU then reads and executes the code to perform the tasks identified in the program, which configures the general-purpose deposition system into a deposition system suitable for performing the desired process.

Figure 2:
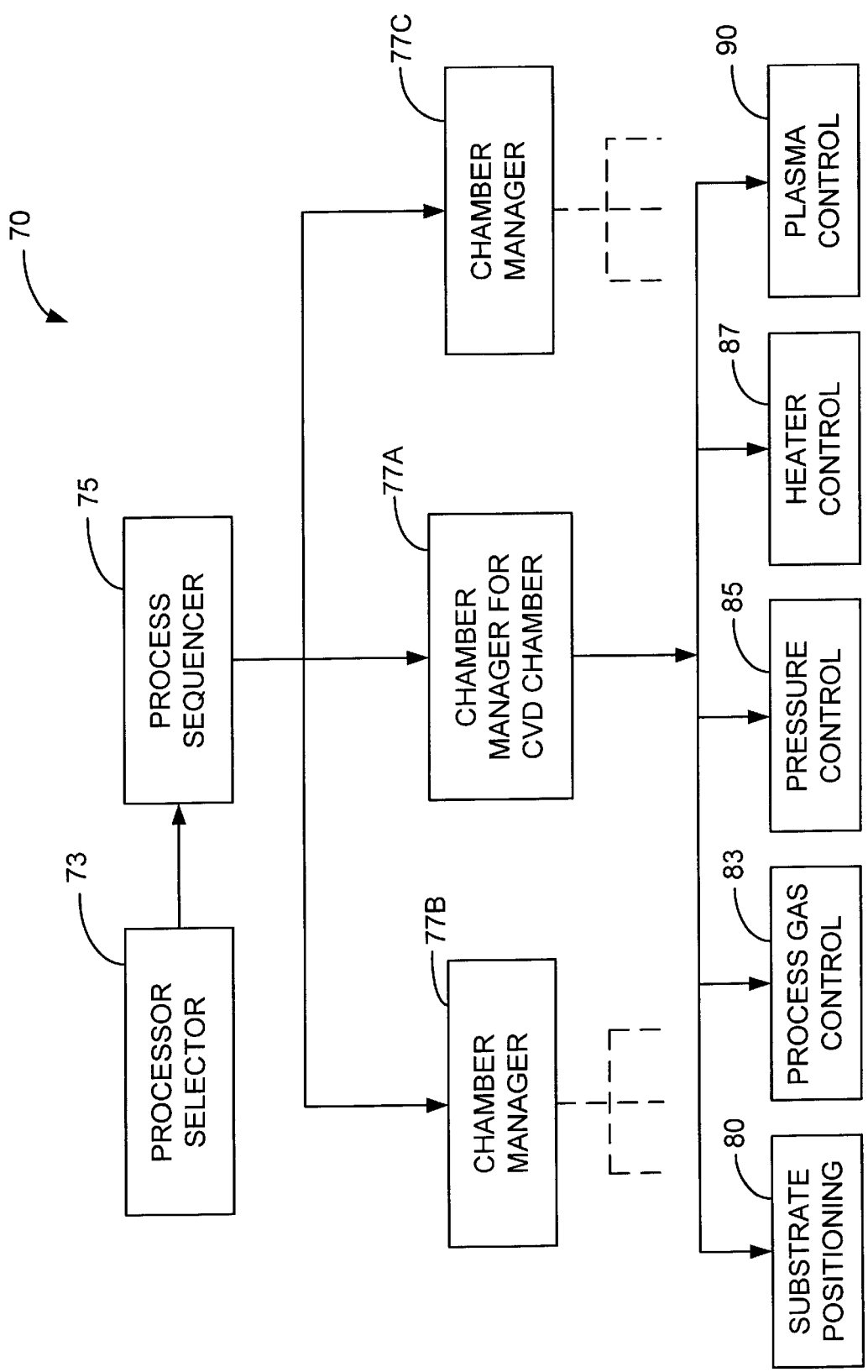
FIG. 2 is a block diagram of one embodiment of the hierarchical control structure of the system control software that controls the operation of the CVD apparatus shown in FIG. 1A.

FIG. 2 is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies the desired process chamber and the desired set of process parameters needed to configure the process chamber for performing the desired process. The process parameters for performing a specific process relate to process conditions such as process gas composition and flow rates, temperature, pressure, plasma conditions such as RF power levels and frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes program code to perform the steps of monitoring the operation of the process chambers to determine if the chambers are being used, determining what processes are being carried out in the chambers being used, and executing the desired process based on availability of a process chamber and type of process to be carried out. Conventional methods of monitoring the process chambers can be used, such as polling. The sequencer subroutine 75 takes the present condition of the process chamber being used into consideration when scheduling which process is to be executed, in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber according to the process set determined by the sequencer subroutine 75. For example, the chamber manager subroutine 77a comprises program code for controlling sputtering and CVD process operations in the process chamber. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. The substrate positioning subroutine 80 comprises program code for controlling chamber components that are used to load the substrate onto pedestal the 12 and, optionally, to lift the substrate to a desired height in the chamber 15 to control the spacing between the substrate and the gas distribution manifold 11. When a substrate is loaded into the process chamber 15, the pedestal 12 is lowered to receive the substrate, and thereafter, the pedestal 12 is raised to the desired height in the chamber, to maintain the substrate at a first distance or spacing from the gas distribution manifold during the CVD process. In operation, the substrate positioning subroutine 80 controls movement of the pedestal 12 in response to process set parameters related to the support height that are transferred from the chamber manager subroutine 77a.

The process gas control subroutine 83 has program code for controlling process gas composition and flow rates. The process gas control subroutine 83 controls the position of the safety shut-off valves, and also ramps the mass flow controllers ("MFCs") up or down to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading a feedback signal from the appropriate mass flow controllers that indicates the actual flow rate through the MFC, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, tetraethylorthosilane ("TEOS"), the process gas control subroutine 83 is written to include steps for bubbling a delivery gas, such as helium, through the liquid precursor in a bubbler assembly or introducing a carrier gas, such as helium or nitrogen, to a liquid injection system.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, to compare the measure value(s) to the target pressure, to obtain PID proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heater that is used to heat the substrate on the pedestal surface 12a. The heater control subroutine 87 is also invoked by the chamber manager subroutine 77a and receives a target, or set-point, temperature parameter. The heater control subroutine 87 measures the temperature by measuring voltage output of a thermocouple located in the pedestal 12, comparing the measured temperature to the set-point temperature, and increasing or decreasing the current supplied to the heater, as appropriate, to obtain the set-point temperature. The temperature is obtained from the measured voltage by looking up the corresponding temperature in a stored conversion table, or by calculating the temperature using a fourth-order polynomial. When an embedded loop heating element is used to heat the pedestal 12, the heater control subroutine 87 gradually controls a ramp up/down of current applied to the heating element. Additionally, a built-in fail-safe mode can be included to detect process safety compliance, and can shut down operation of the heating unit if the process chamber 15 is not properly set up.

The plasma control subroutine 90, which is invoked by the chamber manager subroutine 77a, includes program code for controlling the in situ plasma system and the remote plasma system. The plasma control subroutine can set the low and high frequency RF power levels applied to the process electrodes in the chamber 15 and for setting the low frequency RF frequency employed in an in situ plasma process. In a preferred embodiment, the remote plasma system 27 uses a magnetron as the power supply 28. The magnetron typically operates at a fixed frequency, e.g. 2.45 GHz, and a fixed output power level; however, the power delivered to the cavity 29 may be controlled by adjusting the duty cycle of the magnetron. The plasma control subroutine may therefore include code for repeatedly turning the magnetron on and off in a selected manner.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

III. Exemplary Process Flow

Figure 3A:
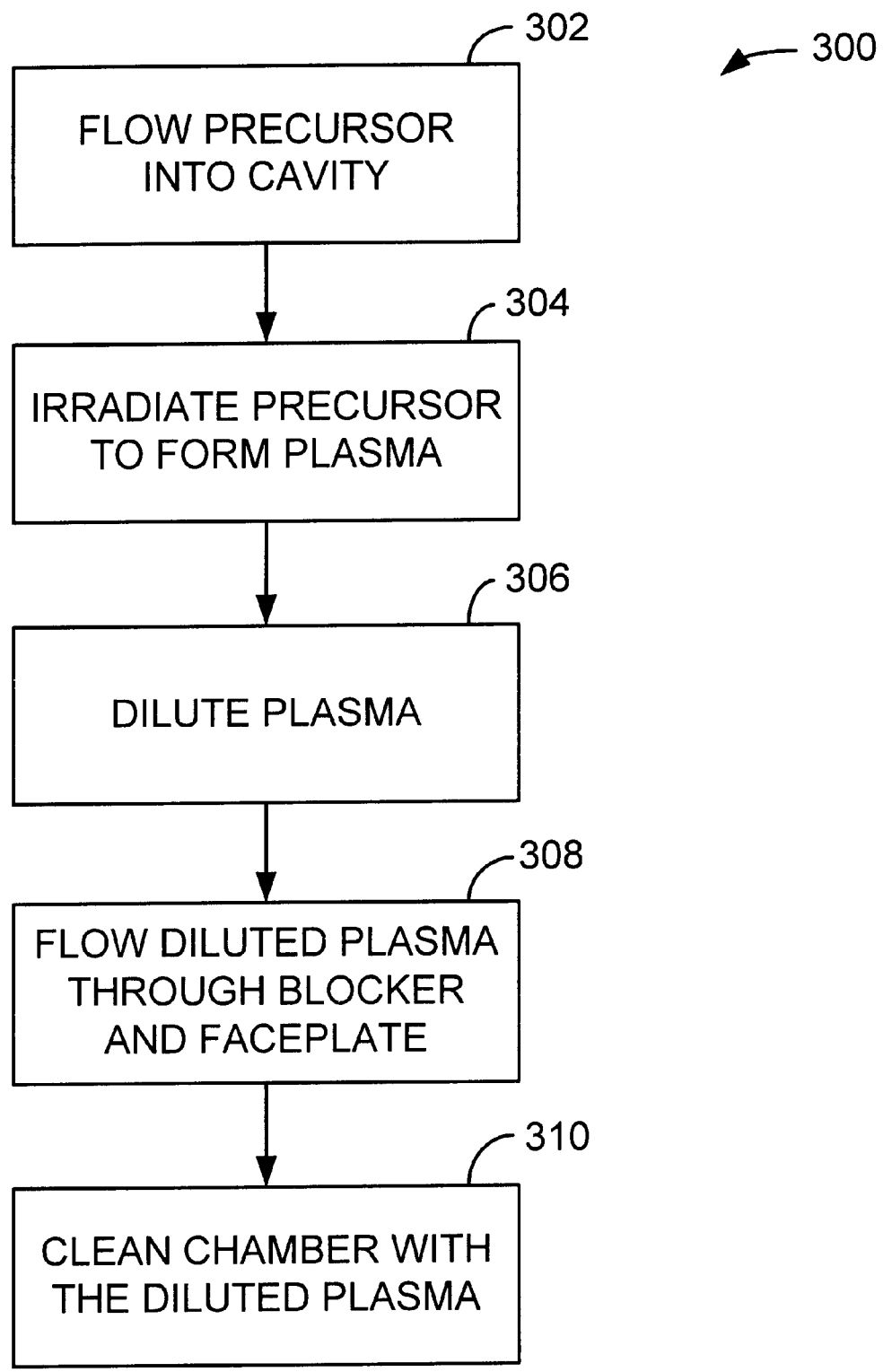
FIG. 3A is a simplified flow chart of a chamber cleaning process according to an embodiment of the present invention.

FIG. 3A is a simplified flow chart representing an example of a cleaning process 300 according to the present invention. Cleaning process 300 typically occurs after one or more substrate processing operations are completed and the substrate is transferred out of the substrate processing chamber. Process 300 flows a cleaning plasma precursor, such as $NF_3$, into the remote microwave cavity (step 302), where the cleaning plasma precursor is irradiated with microwave energy to dissociate the precursor into plasma species to form a plasma (step 304). Plasma species may include atoms or molecules with a heightened energy state, ions, radicals, and/or other particles. The plasma is then diluted with a gas, such as nitrogen, (step 306), typically in a plenum formed between the blocker plate and the gas box, but in some embodiments in a plenum formed between the gas distribution faceplate and the blocker plate, before the plasma flows through the gas distribution faceplate into the chamber (step 308). After being irradiated, the plasma species typically decay (combine or recombine into stable molecules, emit photon or phonon energy, etc.) at rates according to several conditions, such as pressure, plasma composition, and the nature of the surfaces in contact with the plasma. The chamber is then cleaned of deposits (step 310), such as silicon oxide glass, at an enhanced rate and more thoroughly with the diluted plasma. That is, the diluted plasma is more efficient at cleaning the chamber than non-diluted plasma in a similar system would be.

The present inventors developed the chamber clean process described in FIG. 3A in an effort to develop a chamber clean process for a new 300 mm substrate processing chamber that uses the same remote microwave source as used with a 200 mm substrate processing chamber. The 200 mm chamber clean process used a magnetron that generated approximately 1.5 kW (maximum) of microwave power to form a cleaning plasma from $NF_3$ flowing through the remote plasma generator cavity. $NF_3$ was flowed at a rate of about 700 sccm at a pressure of between about 1–1.5 Torr (measured in the process chamber). The cleaning plasma was used to remove silicon oxide glass deposits from the interior surfaces of the deposition chamber and related structures, such as the gas distribution faceplate.

It was desired to develop a similar cleaning process for cleaning chambers configured to process 300 mm wafers. At first, the present inventors tried to use the same clean process used to clean 200 mm chambers. This process, however, failed to achieve a thorough cleaning of the chamber even after running the clean operation for extended periods of time. After cleaning, a gas distribution faceplate used to deposit silicon oxide glass on 300 mm wafers had two distinct regions. The first region, extending from the center of the gas distribution faceplate to about 100 mm from the center, appeared to be clean metal. The second region, extending from approximately the perimeter of the first region to the perimeter of the gas distribution faceplate, had a residue of white powder on the surface of the gas distribution faceplate and within the holes of the gas distribution faceplate. Clumps of white powder were also present in the perimeter exhaust channel, especially near the exhaust port holes.

The inventors determined that the cleaning plasma species flowing into the chamber was not reaching the outer edges of the reaction region and the exhaust structures in sufficient concentration to efficiently perform the desired cleaning in the 300 mm chamber clean. The inventors tried increasing the flow rate of $NF_3$ into the remote plasma generator cavity, but this changed the impedance of the cavity and power-transfer characteristics of the remote plasma system. In addition to reducing the efficiency of plasma generation, increasing the flow of the etchant gas ($NF_3$) resulted in an increased effluent stream and increased raw material. It should be noted that cleaning plasma precursors typically contain halogens, such as fluorine, and that it is therefore desirable to limit the effluent stream of a process using these sorts of compounds.

Figure 4:
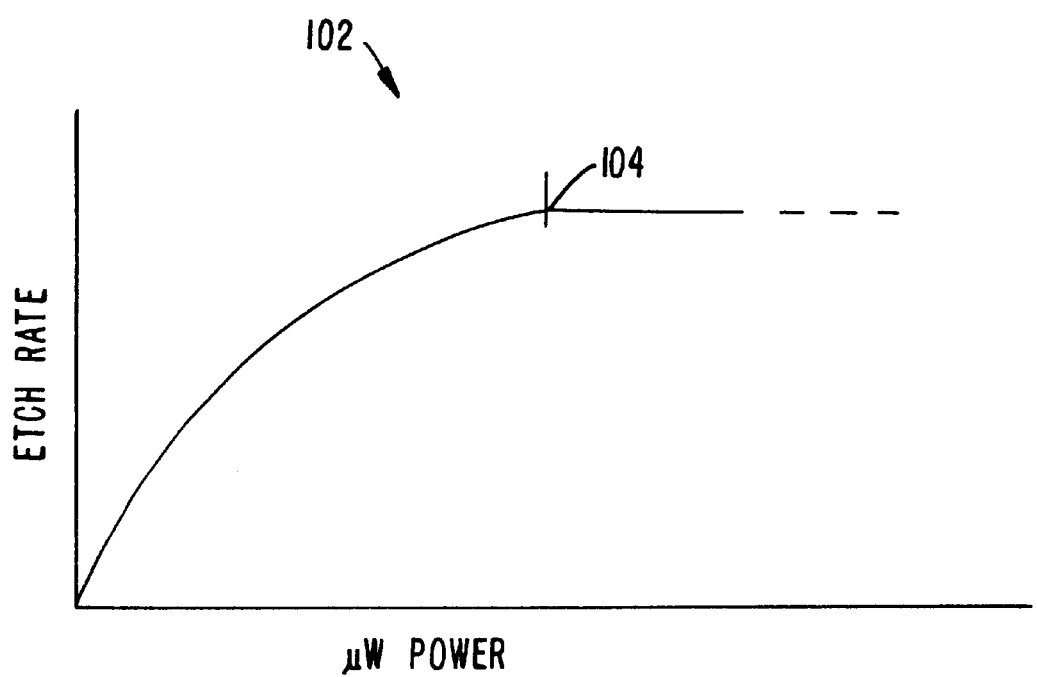
FIG. 4 is a simplified graph of etch rate versus remote plasma generator power illustrating saturation.

FIG. 4 is a simplified graph 102 representing etch rate versus microwave power at a fixed gas flow rate. Given a fixed power budget for the remote plasma system, it is desirable to irradiate only what is necessary while providing consistent and repeatable cleaning processes. Thus the microwave plasma generator is operated in "saturation" mode. Saturation mode is the point 104 at which the etch rate does not increase with increasing microwave power. It is presumed that at this point applying more microwave power does not result in a more effective cleaning plasma.

Surprisingly, it was found that diluting the cleaning plasma with a non-reactive gas down-stream from the plasma generator adequately cleaned the 300 mm deposition system and also reduced the total cleaning time. Under one set of conditions, a cleaning process using a diluent gas required only ⅕ the time that a similar process without a diluent gas took. Specifically, a 1,000 Å film of undoped silicon glass required 300 seconds to be removed using a remotely generated plasma without a diluent gas. A similar film under similar chamber conditions required only 70 seconds to be removed when the cleaning plasma was diluted with a flow of diluent gas between the plasma generator and the substrate. Furthermore, the cleaning process using the diluent gas showed improved cleaning of residue from the pumping channel.

Although it appears counter-intuitive that diluting the cleaning plasma could improve the cleaning process, it is believed that the improvements occur for at least two reasons. First, injecting a diluent gas increases the flow rate (at a given chamber pressure) between the point where the plasma and diluent are mixed and the chamber exhaust system. The increased flow rate can carry more fluorine radicals in the plasma to the outer edges of the deposition system before the fluorine radicals combine into diatomic fluorine or otherwise react. However, it is not necessary that the chamber pressure remain constant between the various cleaning processes. It is further noteworthy that the chamber walls or other surfaces can accelerate the decay of fluorine radicals, and a lower flow rate will support a higher concentration gradient. Second, the non-reactive diluent gas changes the distribution of fluorine radicals in the diluted plasma, lowering the probability that two radicals will combine, and hence may increase the lifetime of these cleaning species.

FIG. 5A is a simplified representation of how nitrogen and cleaning plasma is supplied to a plenum 60 to mix before flowing through the blocker plate 42. In a particular embodiment, the nitrogen flow was 700 sccm, essentially equal to the flow of cleaning precursor, e.g. $NF_3$, into the remote plasma generator. However, the gas flows recited and described above are optimized for deposition processes run in a DxZ™ chamber manufactured by APPLIED MATERIALS, INC., of Santa Clara, Calif., outfitted for 300 mm wafers. The DxZ™ chamber was used in a 300 CENTURA™ substrate processing system, also available from APPLIED MATERIALS, INC. However, these systems are exemplary only. For example, the chamber could be configured for 200 mm wafers or other substrates, and the chamber could be used with other systems, such as a P5000™ system or a PRODUCER™ system, also available from APPLIED MATERIALS, INC., or other chambers and systems available from other processing equipment manufactures could be used. A person of ordinary skill in the art will recognize that the rates at which various precursor gases in the process gas are introduced are in part chamber specific and will vary if chambers of other design and/or volume are employed. Furthermore, a person of ordinary skill in the art will recognize that the precursor, diluent, and rates provided above as examples relate to cleaning or etching silicon oxide glass. Other precursors, diluents, and/or rates may be appropriate for enhancing the cleaning or etching rate and/or uniformity of other dielectric materials, such as silicon nitride, or even conductive materials, such as polysilicon, silicide, and metals.

Generally it is desired that the diluent not combine with the cleaning species in the plasma, or facilitate the decay of cleaning species, as it is desirable to maintain a high concentration of cleaning species to the outer perimeter of the processing chamber. Improved cleaning results were achieved using a ceramic separator tube 62 to convey the plasma from the remote plasma generator 27 to the plenum 60 keeping the plasma separate from the diluent until reaching an inlet to the plenum. The separator tube 62 is inserted through a hole in the mixing block 9 and gas box 11. Diluent gas ($N_2$) is flown through the input manifold to the mixing block 9; however, the diluent gas does not mix with the plasma at this point. Instead, the diluent gas flows in a coaxial fashion, separated from the plasma by the separator tube, to mix in the plenum 60. The outer diameter of the ceramic tube is slightly smaller than the hole, or diluent conduit, through the mixing block and gas box, allowing for diluent flow. The tube could be materials other than ceramic, but ceramic is resistant to attack by the cleaning plasma. Additionally, it is believed that the ceramic material reduces the surface recombination or reaction of cleaning species in the plasma, compared to a metal tube, for example.

The diluent gas flow is provided in a circumferential, annular fashion to the plasma flow and mixed in the plenum 60 between the gas box 11 and the blocker plate 42. It is believed that supplying the plasma and diluent gas to the plenum in this fashion improves mixing uniformity and improves etching or cleaning. The mixture then flows through the blocker plate 42 and the gas distribution faceplate (not shown in this figure), both of which disperse the gas-plasma mixture before flowing into the chamber. In an alternative embodiment, the separator tube extends through the blocker plate into a plenum between the blocker plate and the faceplate. Mixing the diluent with the plasma after forming the plasma, as opposed to prior to or during plasma formation, allows the remote plasma generator to be operated in an optimum manner, matching the flow of cleaning precursor to the cavity dimensions, magnetron power output, and operating pressure. This in turn insures that the precursor will be efficiently converted to plasma, with a minimum of unconverted precursor in the effluent stream. The optimum plasma density for forming the plasma; however, is not necessarily the optimum plasma density for cleaning the chamber or etching a wafer. A remote microwave plasma generator is desirable because of the efficiency of conversion of cleaning gas precursors, and because a striker gas, such as argon, is generally not needed to initiate the plasma. However, other plasma systems, such as a remote RF plasma generator, could be used.

Figure 5B:
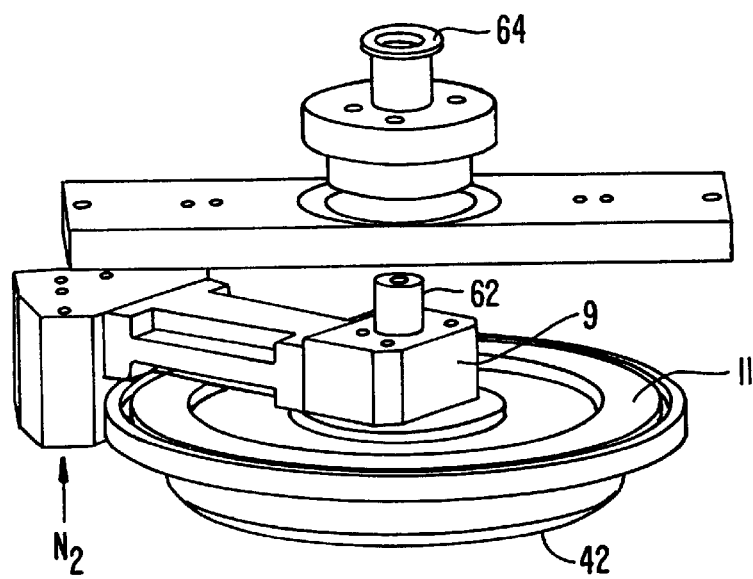
FIG. 5B is a simplified view of a portion of the plasma diluent configuration shown in FIG. 5A.

FIG. 5B is a simplified view of a portion of a wafer processing system in accordance with FIG. 5A. The ceramic tube 62 is inserted through the mixing block 9 and gas box 11. The remote plasma generator (not shown) attaches to the flange 64.

Figure 6A:
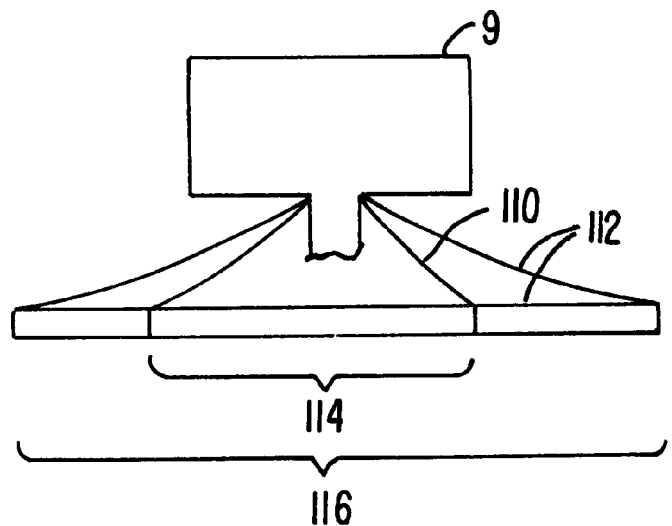
FIG. 6A is a simplified diagram illustrating the increased cleaning area achieved by diluting a cleaning plasma.

FIG. 6A is a simplified representation of what is believed to be the fluorine radical distribution from the blocker plate 42 across the faceplate 13a for undiluted plasma 110 and diluted plasma 112 from the remote plasma generator. For ease of explanation only, the area cleaned by the undiluted plasma 114 represents the area of a nominally 200 mm faceplate, while the area cleaned by the diluted plasma 116 represents the area of a nominally 300 mm faceplate.

Figure 6B:
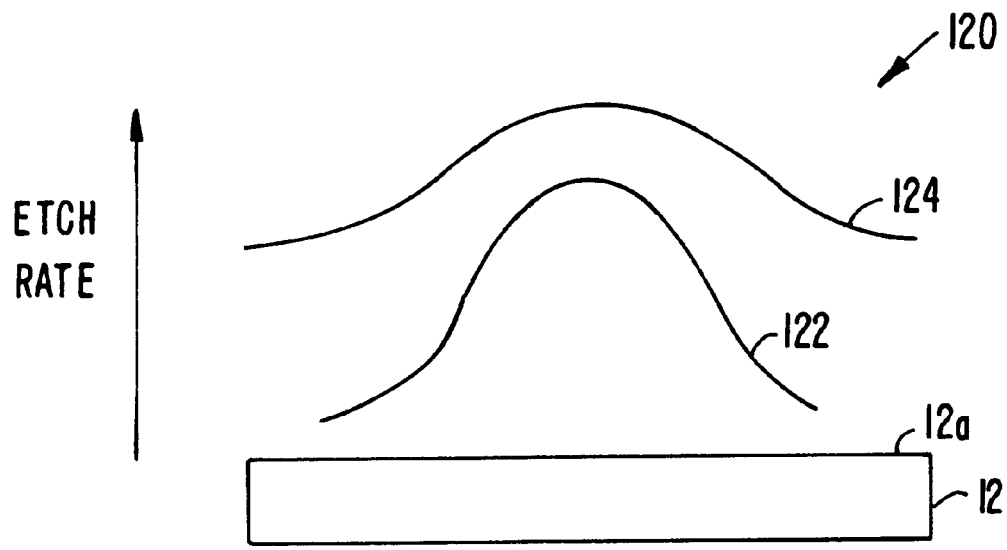
FIG. 6B is a simplified diagram illustrating the how etch characteristics across a wafer pedestal can be selected with diluent flow.

FIG. 6B is a simplified diagram 120 of the etch rate versus distance across the diameter of a pedestal surface 12a. The etch rate of undiluted plasma 122 is both lower and less uniform across the diameter of the pedestal surface than the etch rate of diluted plasma 124. The etch characteristics of the diluted plasma are more desirable for both effects. Etch uniformity is desirable to insure that a process, either a cleaning process or a wafer etch process, is performed to completion across the desired area without overetching. The higher etch rate is desirable to lower the time needed to complete a particular process, thus improving throughput of the processing equipment.

Figure 7A:
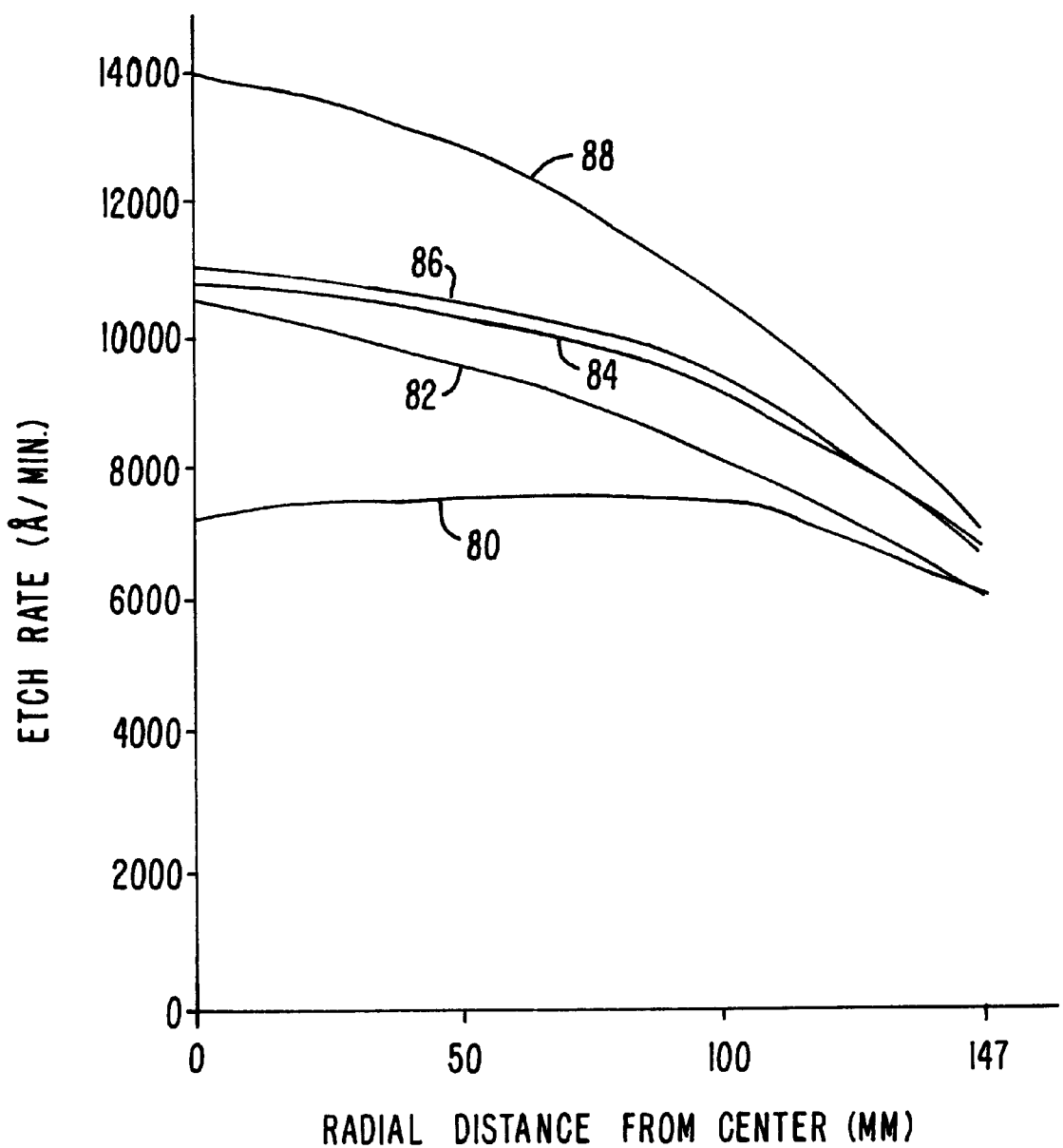
FIGS. 7A and 7B are a simplified graphs of etch rate across a wafer for various process conditions illustrating the effect of various diluent gases, flows, and exhaust settings.

FIG. 7A is a simplified graph of etch rate versus distance from the center of a wafer for a 300 mm wafer. A 250 mil thick silane-based undoped silicon glass film was deposited on nominally 300 mm test wafers. The wafers were etched in a 300 CENTURA™ DxZ™ system with a remote microwave plasma generator. $NF_3$ at a flow rate of 700 sccm was used for all samples, and the throttle valve was fully open for all samples in this group. An etch was performed for a standard time, and the thickness of the glass film was measured at a number of points. One data point was taken at the center of each wafer. Sixteen data points were measured at a radius of 50 mm from the center, 33 points were measured at a radius of 100 mm from the center, and 40 data points were measured at a radius of 147 mm from the center. The lowest curve 80 represents the etch rate of undiluted plasma. The average etch rate for the undiluted plasma was about 7100 A/min. The next curve 82 represents the etch rate using a helium diluent flow of 700 sccm. The curve of etch rate with a nitrogen diluent flow of 700 sccm 84 is only slightly lower than that of the etch rate with an argon diluent flow of 700 sccm 86, thus nitrogen is a preferred diluent. Surprisingly, the etch rate with a nitrogen diluent flow of 1400 sccm 88 is considerably higher at the center of the wafer than the etch rate with 700 sccm 84; however, there is a greater range of etch rates with the 1400 sccm diluent flow rate, thus superior etch uniformity is achieved with a diluent flow rate of 700 sccm. Of course, a higher diluent flow rate may be more desirable under different conditions, such as with smaller substrates, to utilize the increased etch rate. For purposes of comparison, the average etch rate using 700 sccm of nitrogen diluent flow was 10,894 A/min and was 11,129 A/min. with 1,400 sccm of nitrogen diluent flow.

Figure 7B:
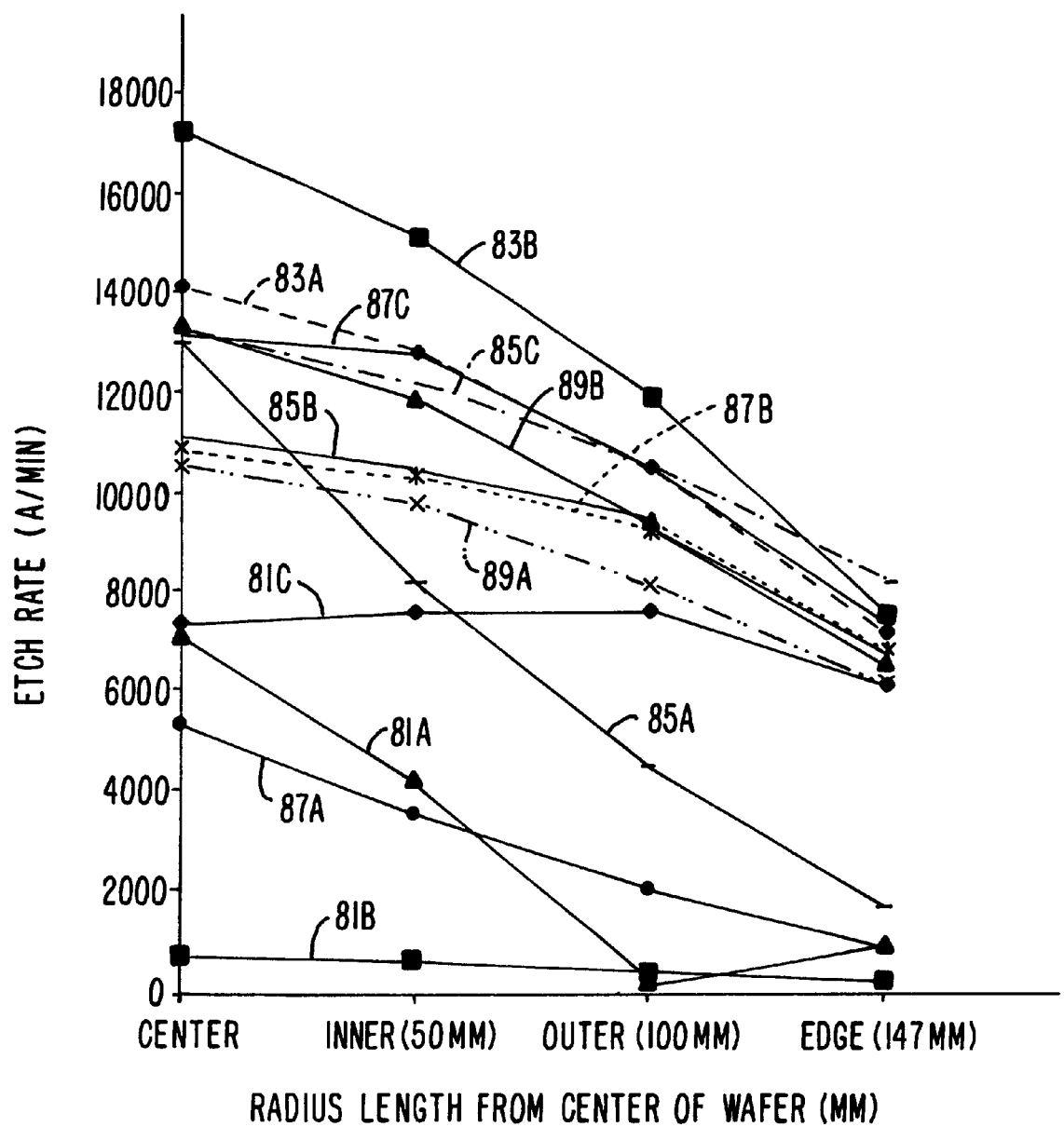

FIG. 7B is a simplified graph of etch rate versus distance from the center of a wafer illustrating the effect various process conditions have on etch rate. Three curves 81A, 81B, and 81C represent the etch rate for undiluted plasma at a chamber pressure of 3 Torr, 1.5 Torr, and with the throttle valve fully open (fixed), respectively. Thus, the etch process may be performed with the throttle valve fixed in the fully open position, without pressure control feedback. However, it was determined that high, uniform etch rates were achieved with the throttle valve fixed in a partially open setting.

Curve 83A represents the etch rate using a nitrogen diluent flow of 1,400 sccm with the throttle valve fully open. Curve 83B represents the etch rate using a nitrogen diluent flow of 1,400 sccm with the throttle valve in a fixed position representing 26% open.

Similarly, curve 85A represents the etch rate using an argon diluent flow of 700 sccm at a chamber pressure controlled to 3 Torr. In comparison, curve 85B represents the etch rate using an argon diluent flow of 700 sccm with the throttle valve fully open, and curve 85C represents the etch rate using an argon diluent flow of 700 sccm with the throttle valve fixed at 26% open. Curve 89A represents the etch rate using helium diluent at a flow of 700 sccm with the throttle valve fully open, and curve 89B represents the etch rate using helium diluent at a flow of 700 sccm with the throttle valve 26% open.

Finally, curve 87A represents the etch rate using nitrogen at a flow of 700 sccm at a controlled chamber pressure of 3 T, curve 87B represents the etch rate using nitrogen at a flow of 700 sccm with the throttle valve fully open, and curve 87C represents the etch rate using nitrogen at a flow of 700 sccm with the throttle valve 26% open.

This data shows that a variety of diluent gases can be used to achieve superior etch performance. Similarly, superior etch performance is obtained over a variety of chamber conditions, such as chamber pressure and/or exhaust system operation. In a particular embodiment, the diluent flow is approximately equal to the flow of the clean gas, each at about 700 sccm for a 300 mm system, and the throttle valve is fixed at 26% open.

Figure 3B:
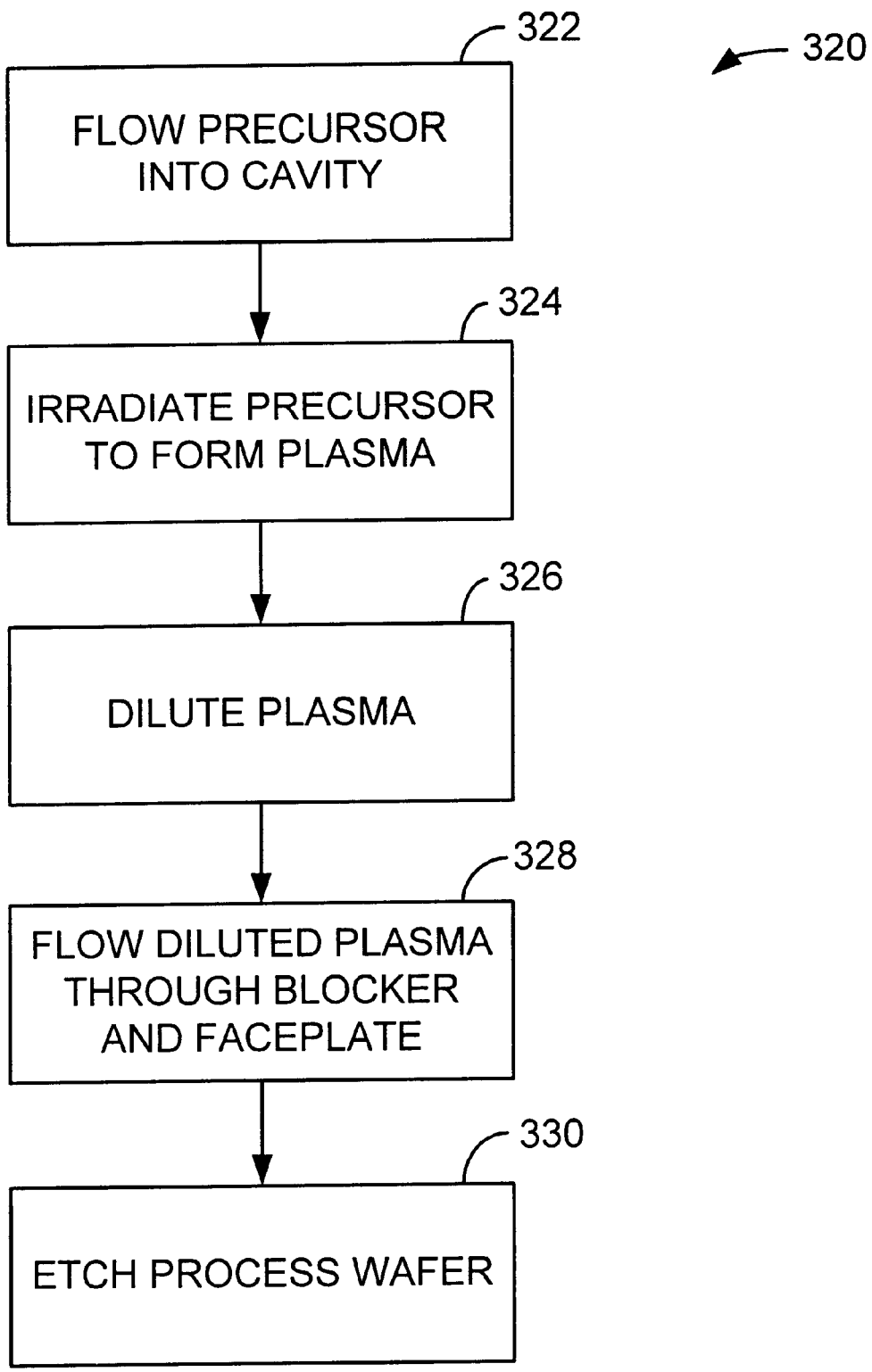
FIG. 3B is a simplified flowchart of a wafer etch process according to an embodiment of the present invention.

The remote plasma dilution process developed by the present inventors can be used to etch substrates in addition to cleaning chamber walls. When used in a substrate etching process the present invention allows for improved etch uniformity across the substrate surface. FIG. 3B is a simplified flow chart representing a substrate etching process (320) according to the present invention. In contrast to chamber cleaning process 300 shown in FIG. 3A, etching process 320 occurs with the substrate in the substrate processing chamber. Process 320 flows an etchant plasma precursor, such as $NF_3$, into the remote microwave cavity (step 322), where the etchant plasma precursor is irradiated with microwave energy to dissociate the precursor into plasma species and form a plasma (step 324). The plasma is then diluted with a gas, such as nitrogen (step 326), as described above in reference to FIG. 3A, before being flowed into the chamber (step 328) through the gas distribution faceplate. A process wafer is etched (step 330) with the diluted plasma. Diluting the plasma provides an additional degree of control of the etch rate and etch uniformity, as well as increased etch rate and improved etch uniformity.

IV. Exemplary Device Structure

Figure 8:
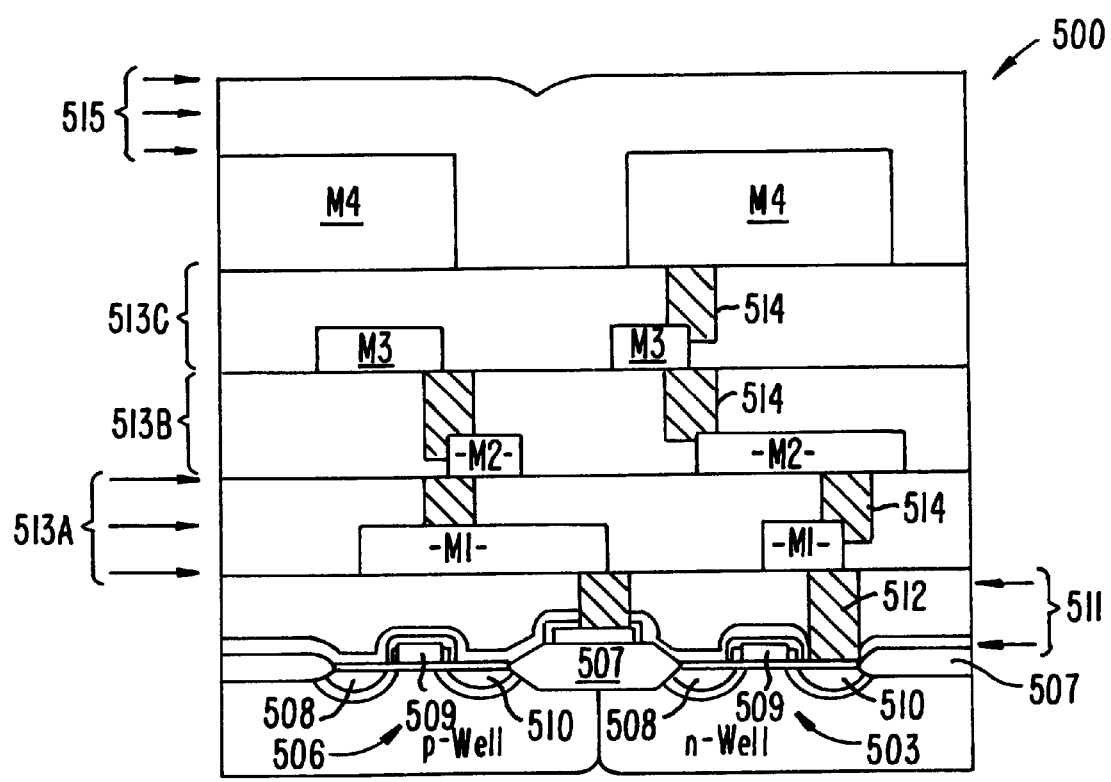
FIG. 8 is a simplified representation of a cross section of a semiconductor device fabricated according to an embodiment of the present invention.

FIG. 8 illustrates a simplified cross-sectional view of an integrated circuit 500 that can be manufactured using the method of the present invention. Integrated circuit 500 may be fabricated on a semiconductor wafer, such as a silicon wafer, gallium-arsenide wafer, or other wafer. As shown in FIG. 8, integrated circuit 500 includes NMOS and PMOS transistors 503 and 506, which are separated and electrically isolated from each other by a field oxide region 507. Each transistor 503 and 506 comprises a source region 508, a gate region 509, and a drain region 510.

A premetal dielectric layer 511 separates transistors 503 and 506 from metal layer M1, with connections between metal layer M1 and the transistors made by contacts 512. Metal layer M1 is one of four metal layers, M1–M4, included in integrated circuit 500. Each metal layer M1–M4 is separated from adjacent metal layers by respective intermetal dielectric (IMD) layers 513A–C. Adjacent metal layers are connected at selected openings by vias 514. Planar passivation layer 515 overlies metal layer M4.

Embodiments of the present invention may be useful in etching contact vias through dielectric layers, planarizing dielectric layers, etching back dielectric layers, and/or in similar process steps, and may be applied to other types of materials with selection of a suitable plasma precursor and diluent. It should be understood that the simplified integrated circuit 500 is for illustrative purposes only. One of ordinary skill in the art could implement the present method for fabrication of other integrated circuits, such as microprocessors, application-specific integrated circuits, memory devices, and the like. Additionally, the method of the present invention may be used in the fabrication of integrated circuits using other technologies, such as BiCMOS, NMOS, bipolar, and others.

While the above invention has been described in tens of a cleaning plasma formed from $NF_3$, other clean gas plasma precursors may be applicable, such as $C_2F_6$, $C_3F_8$, $CF_4$, $F_2$, $O_2$, $Cl_2$ and $ClF_3$. Additionally, while a remote plasma system has been described in terms of a magnetron source operating at approximately 2.45 GHz, other types of sources may be used, such as continuous-wave microwave or radio-frequency sources could be used. Therefore, the method of the present invention is not intended to be limited by the specific parameters and examples set forth above. Those of ordinary skill in the art will realize that different processing conditions and different reactant sources can be used without departing from the spirit of the invention. These equivalents and alternatives are intended to be included within the scope of the present invention. Other variations will be apparent to persons of skill in the art. Accordingly, it is not intended to limit the invention except as provided in the appended claims.

What is claimed is:

1. A method of cleaning deposits of dielectric material from a deposition chamber, the method comprising:

flowing a cleaning plasma precursor into a remote plasma generator;

irradiating the cleaning plasma precursor in the remote plasma generator to form a cleaning plasma suitable for cleaning the deposits of dielectric material from surfaces of the deposition chamber;

flowing the cleaning plasma from the remote plasma generator to a plenum;

mixing the cleaning plasma with a non-reactive diluent gas in a selected ratio of diluent gas flow to cleaning plasma precursor flow to form an etching mixture with an enhanced etching characteristic, the selected ratio being between about 1:1 to less than 2:1; and flowing the cleaning mixture into the deposition chamber to remove the dielectric material from surfaces of the deposition chamber.

2. The method of claim 1 wherein the dielectric material comprises silicon oxide glass, the non-reactive diluent gas comprises nitrogen, and the cleaning plasma precursor comprises a fluorine-containing compound.

3. The method of claim 1 wherein the flow of the cleaning mixture maintains a pressure in the deposition chamber of at least about 1 Torr.

4. The method of claim 1 wherein the cleaning plasma precursor flow is greater than about 80 sccm/liter of chamber volume.

5. A method of controlling the etching profile of an substrate processing system, the method comprising:

flowing plasma precursor into a remote plasma generator at a first selected flow rate;

forming an etching plasma from the plasma precursor in the remote plasma generator;

flowing the etching plasma into a plenum;

flowing a diluent gas into the plenum at a second selected flow rate to dilute the etching plasma and form an etching mixture.

6. The method of claim 5 wherein the first selected rate is selected according to a conversion efficiency of the remote plasma generator.

7. A method for etching a process wafer, the method comprising:

placing the process wafer in a processing chamber;

flowing an etching plasma precursor into a remote plasma generator;

irradiating the etching plasma precursor in the remote plasma generator to form an etching plasma;

flowing the etching plasma from the remote plasma generator to a gas mixing region;

mixing the etching plasma with a diluent gas in a selected ratio of plasma precursor flow to diluent gas flow to form an etching mixture; and flowing the etching mixture into the processing chamber to etch the process wafer.

8. The method of claim 7 wherein the gas mixing region is a plenum formed between a gas box and a blocker plate of a chamber lid.

9. The method of claim 7 wherein the diluent gas flow is coaxial to an etching plasma flow at an inlet to the gas mixing region.

10. The method of claim 7 wherein etching plasma precursor comprises $NF_3$.

11. The method of claim 7 wherein the diluent gas comprises $N_2$.

12. The method of claim 7 wherein the process wafer has a dielectric layer on a surface of the process wafer, the etching mixture etching the dielectric layer.

13. The method of claim 12 wherein the dielectric layer comprises silicon oxide glass.

14. The method of claim 7 wherein the selected ratio of plasma precursor flow to diluent flow is about 1:1.

15. A method for etching a process wafer, the method comprising:

placing the process wafer in a processing chamber, the process wafer having a film of silicon oxide glass;

flowing $NF_3$ at a first flow rate into a remote microwave plasma generator;

irradiating the $NF_3$ in the remote microwave plasma generator to form an etching plasma;

flowing the etching plasma from the remote microwave plasma generator to a plenum formed between a gas box and a blocker plate;

flowing $N_2$ gas into the plenum at a second flow rate, the second flow rate being essentially equal to the first flow rate, an N₂ flow being essentially coaxial with an etching plasma flow at an inlet of the plenum;

mixing the etching plasma with the N₂ gas in the plenum to form an etching mixture; and flowing the etching mixture into the processing chamber to etch the film of silicon oxide glass.

16. A substrate processing apparatus lid comprising:

a gas dispersion plate, a lid body, a plenum being formed between the gas dispersion plate and the lid body;

a plasma generator with a plasma outlet;

a separator tube with a plasma inlet coupled to the plasma outlet and a tube outlet coupled to the plenum; and a diluent conduit, a portion of the diluent conduit being coaxial with the separator tube and having a diluent outlet coupled to the plenum, the diluent outlet being annular to the tube outlet.

17. The lid of claim 16 wherein the separator tube comprises ceramic.

18. A substrate-processing apparatus for cleaning deposits of dielectric material from surfaces of a deposition chamber, the apparatus comprising:

(a) a processing chamber;

(b) a gas delivery system configured to deliver a cleaning plasma precursor to a remote plasma generator and to deliver a diluent gas to a gas mixing block (9), an outlet of the remote plasma generator being coupled to an input of the gas mixing block and an outlet of the gas mixing block being coupled to the processing chamber;

(c) an exhaust system coupled to the processing chamber and capable of maintaining a chamber pressure of at least about 1 Torr at a flow rate into the processing chamber of up to about 1,400 sccm;

(d) a controller configured to control said gas delivery system and said remote plasma generator, and said exhaust system; and (e) a memory, coupled to said controller, comprising a computer-readable medium having a computer-readable program embodied therein for directing operation of the substrate processing apparatus, said computer-readable program comprising:

(i) a first set of computer instructions for controlling said gas delivery system to flow the cleaning plasma precursor gas into said remote plasma generator at a first flow rate, (ii) a second set of computer instructions for controlling said gas delivery system to flow the diluent gas into the gas mixing block at a second flow rate, the ratio of the second flow rate to the first flow rate being less than 2:1, to form a cleaning mixture, and (iii) a third set of computer instructions for controlling the exhaust system to maintain a pressure within the processing chamber of at least about 1 Torr, the pressure in the processing chamber flowing the cleaning mixture from the gas mixing block into the processing chamber.

19. The apparatus of claim 18 wherein the third set of computer instructions controls the exhaust system to maintain the pressure within the processing chamber between about 1–1.5 Torr.

* * * * *